US012701849B2

(12) United States Patent
Cheng

(10) Patent No.: US 12,701,849 B2
(45) Date of Patent: Aug. 4, 2026

(54) LIGHT EMITTING STRUCTURES FORMED IN OPENING IN A MASK AND PREPARATION METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 629 days.

(21) Appl. No.: 18/175,325

(22) Filed: Feb. 27, 2023

(65) Prior Publication Data

US 2023/0215906 A1    Jul. 6, 2023

Related U.S. Application Data

(63) Continuation of application No. PCT/CN2020/128094, filed on Nov. 11, 2020.

(51) Int. Cl.
*H10H 29/14*        (2025.01)
*H10H 20/01*        (2025.01)
(Continued)

(52) U.S. Cl.
CPC ........ *H10H 29/142* (2025.01); *H10H 20/814* (2025.01); *H10H 20/0364* (2025.01); *H10H 20/857* (2025.01); *H10H 20/872* (2025.01)

(58) Field of Classification Search
CPC .. H10H 29/142; H10H 20/835; H10H 20/841; H10H 20/814; H10H 20/856; H10H 20/862; H10H 20/872; H10H 20/882
See application file for complete search history.

(56) References Cited

U.S. PATENT DOCUMENTS 9,368,549 B1    6/2016 Oraw et al.
2013/0011656 A1*  1/2013 Zhang ....................... C25F 3/12
                                                    205/684
(Continued)

FOREIGN PATENT DOCUMENTS

CN    101621109 A    1/2010
CN    102122691 A    7/2011
(Continued)

OTHER PUBLICATIONS

Translation of CN_107833878_A (Year: 2018).*
(Continued)

*Primary Examiner* — Aaron J Gray
(74) *Attorney, Agent, or Firm* — Westbridge IP LLC

(57)    ABSTRACT

Disclosed are a light emitting structure and a preparation method therefor. The method includes: forming a mask layer on a n-type substrate, disposing a plurality of openings in the mask layer; and forming a light emitting unit in each of the plurality of openings, including: forming a metal atomic layer in the opening; forming an n-type semiconductor layer on the metal atomic layer, and forming a light extraction structure on the n-type semiconductor layer; and sequentially forming an active layer and a p-type semiconductor layer on the n-type semiconductor layer and the light extraction structure. In this way, step of peeling off the substrate may be avoided. In addition, with a plurality of discrete light emitting structures formed on the same substrate, a step of cutting a device is avoided, and damage to the device can be prevented.

10 Claims, 7 Drawing Sheets

(51) Int. Cl.

| | | |
|---|---|---|
| *H10H 20/80* | (2025.01) | |
| *H10H 20/814* | (2025.01) | |
| *H10H 20/857* | (2025.01) | |

(56) References Cited

U.S. PATENT DOCUMENTS

| | | | |
|---|---|---|---|
| 2017/0117437 A1 * | 4/2017 | Shur et al. | |
| 2019/0165038 A1 * | 5/2019 | Chae ................... | H10H 29/142 |

FOREIGN PATENT DOCUMENTS

| | | | | | |
|---|---|---|---|---|---|
| CN | 103762286 A | | 4/2014 | | |
| CN | 107833878 A | * | 3/2018 | ........... | H10W 90/00 |
| CN | 107946417 A | | 4/2018 | | |
| CN | 110838538 A | * | 2/2020 | .......... | H10H 20/819 |
| CN | 111430518 A | | 7/2020 | | |
| JP | 2007165908 A | | 6/2007 | | |
| KR | 20170074296 A | | 6/2017 | | |

OTHER PUBLICATIONS

Translation of CN 110838538 A (Year: 2020).*

First Office Action issued in counterpart Chinese Patent Application No. 202080106825.5, dated Mar. 1, 2025.

International Search Report issued in corresponding PCT Application No. PCT/CN2020/128094, dated Aug. 10, 2021.

Written Opinion issued in corresponding PCT Application No. PCT/CN2020/128094, dated Aug. 10, 2021.

* cited by examiner

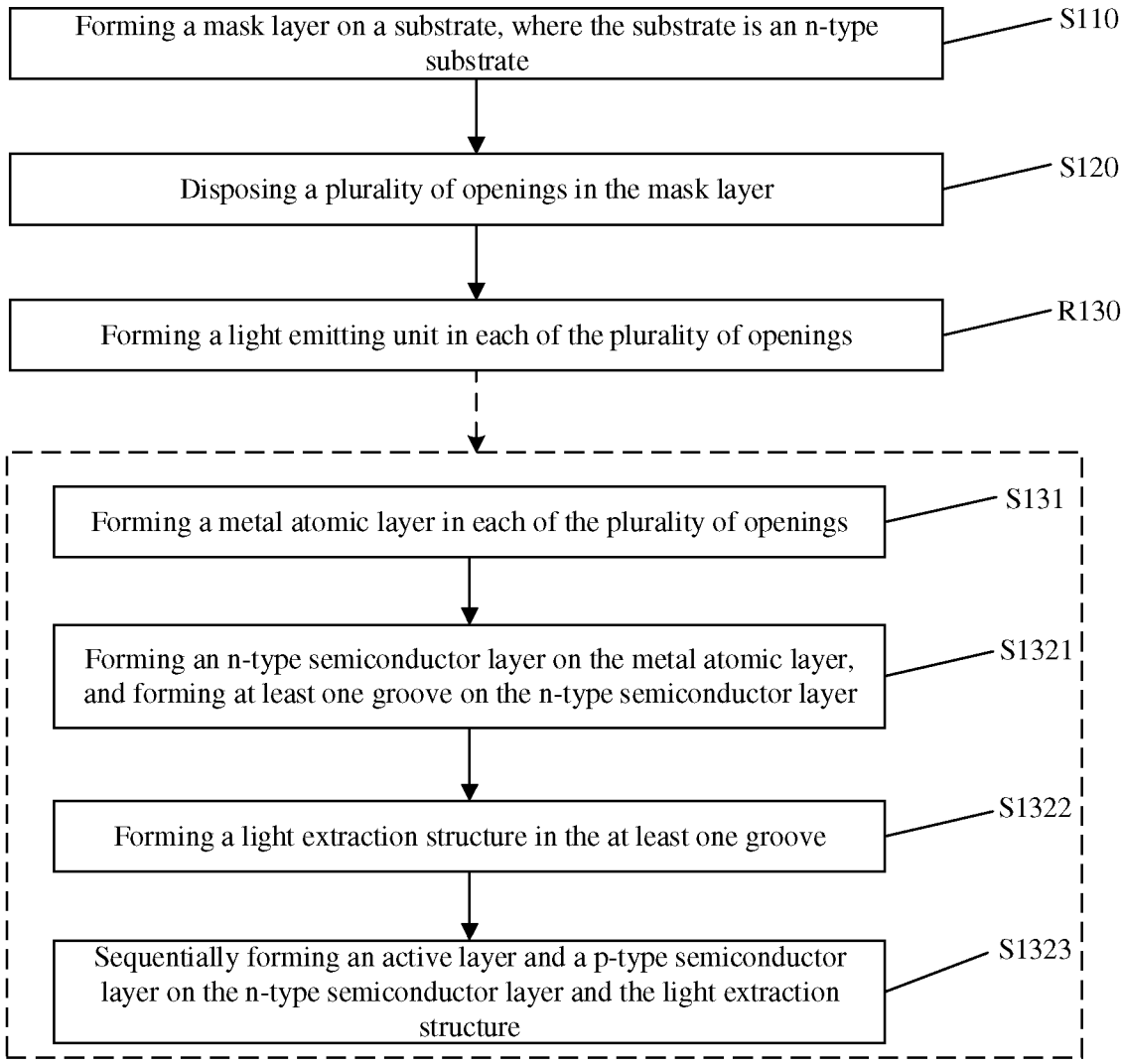

Forming a mask layer on a substrate, where the substrate is an n-type substrate ⟶ S110

Disposing a plurality of openings in the mask layer ⟶ S120

Forming a light emitting unit in each of the plurality of openings ⟶ R130

Forming a metal atomic layer in each of the plurality of openings ⟶ S131

Forming an n-type semiconductor layer on the metal atomic layer, and forming at least one groove on the n-type semiconductor layer ⟶ S1321

Forming a light extraction structure in the at least one groove ⟶ S1322

Sequentially forming an active layer and a p-type semiconductor layer on the n-type semiconductor layer and the light extraction structure ⟶ S1323

LIGHT EMITTING STRUCTURES FORMED IN OPENING IN A MASK AND PREPARATION METHOD THEREFOR

CROSS-REFERENCE TO RELATED APPLICATIONS

This application is a continuation of International Application No. PCT/CN2020/128094, filed on Nov. 11, 2020, the disclosure of which is hereby incorporated by reference in its entirety.

TECHNICAL FIELD

The present application relates to the field of light emitting diode technologies, and in particular, to a light emitting structure and a preparation method therefor.

BACKGROUND

Compared with a conventional light emitting diode with a planar structure, a light emitting diode (LED) with a vertical structure has great advantages in terms of light extraction efficiency, heat dissipation speed, and the like.

However, in the conventional technologies, a preparation method for the light emitting diode with a vertical structure is very complicated. After a light emitting structure is formed, a substrate for growing an epitaxial layer often needs to be peeled off, and the epitaxial layer is then bonded to a new substrate with high conductivity. Moreover, to obtain a plurality of discrete devices, a prepared monolithic device also need to be further cut, to separate the plurality of vertical structured light-emitting diodes on the same substrate. Such a complex preparation process makes it difficult to improve production efficiency, and a device is easily damaged in a preparation process, resulting in poor product quality.

SUMMARY

In the conventional technologies, major reasons for using a complicated preparation method are as follows. A substrate in the conventional technologies does not have good electrical conductivity, and if peeling is not performed, power of a device is seriously affected. In addition, since an epitaxial structure grows on a monolithic substrate, cutting must be performed to obtain discrete devices.

In view of this, the present disclosure aims to provide a preparation method, and the method is used for preparing a light emitting structure. The method includes:

forming a mask layer on a substrate, where the substrate is an n-type substrate;

disposing a plurality of openings in the mask layer; and forming a light emitting unit in each of the plurality of openings, including:

forming a metal atomic layer in each of the plurality of openings;

forming an n-type semiconductor layer on the metal atomic layer;

forming at least one groove on the n-type semiconductor layer;

forming a light extraction structure in the at least one groove; and sequentially forming an active layer and a p-type semiconductor layer on the n-type semiconductor layer and the light extraction structure.

In an implementation, the method further includes: separately disposing a first electrode on the light emitting unit; and disposing a second electrode on a side of the substrate away from the mask layer, where the plurality of light emitting units share the second electrode.

In an implementation, the metal atomic layer is an Al atomic layer or a Mg atomic layer.

In an implementation, before the forming an n-type semiconductor layer on the metal atomic layer, the method further includes: forming a buffer layer on the metal atomic layer.

In an implementation, after the forming a buffer layer on the metal atomic layer, the method further includes: forming at least one porous semiconductor layer on the buffer layer.

In an implementation, the at least one porous semiconductor layer includes a plurality of porous semiconductor layers, and different porous semiconductor layers have different porosities.

In an implementation, the porous semiconductor layer is made of porous gallium nitride.

In an implementation, the light extraction structure includes a distributed Bragg reflection (DBR) structure and/or a photonic crystal structure.

In an implementation, three adjacent light emitting units constitute a pixel unit, and contents of indium in light extraction structures of the three light emitting units are different from each other.

In an implementation, in each pixel unit, areas of openings corresponding to the three light emitting units are different from each other.

In an implementation, before the forming a mask layer on a substrate, the method further includes: forming a nucleation layer on the substrate.

In addition, the present disclosure further provides a light emitting structure prepared by using the foregoing preparation method. The light emitting structure includes:

a substrate, where the substrate is an n-type substrate;

a mask layer formed on the substrate, where a plurality of openings are disposed in the mask layer; and a plurality of light emitting units formed in the plurality of openings respectively, where each of the plurality of light emitting units sequentially comprises a metal atomic layer, an n-type semiconductor layer, an active layer, and a p-type semiconductor layer from bottom to top, at least one groove is disposed on the n-type semiconductor layer, and a light extraction structure is disposed in the at least one groove.

In an implementation, the light emitting structure further includes: a first electrode separately disposed on each of the plurality of light emitting units; and a second electrode disposed on a side of the substrate away from the mask layer, where the plurality of light emitting units share the second electrode.

In an implementation, the metal atomic layer is an Al atomic layer or a Mg atomic layer.

In an implementation, each of the plurality of light emitting units further includes a buffer layer disposed between the metal atomic layer and the n-type semiconductor layer.

In an implementation, each of the plurality of light emitting units further includes at least one porous semiconductor layer disposed between the buffer layer and the n-type semiconductor layer.

In an implementation, the at least one porous semiconductor layer includes a plurality of porous semiconductor layers, and different porous semiconductor layers have different porosities.

In an implementation, the porous semiconductor layer is made of porous gallium nitride.

In an implementation, the light extraction structure includes a DBR structure and/or a photonic crystal structure.

In an implementation, three adjacent light emitting units constitute a pixel unit, where contents of indium in light extraction structures of the three light emitting units are different from each other.

In an implementation, in each pixel unit, areas of openings corresponding to the three light emitting units are different from each other.

In an implementation, a nucleation layer is further disposed between the substrate and the mask layer.

BRIEF DESCRIPTION OF THE DRAWINGS

FIG. 1 is a schematic flowchart of a preparation method for a light emitting structure according to an embodiment of the present disclosure.

DETAILED DESCRIPTIONS OF THE EMBODIMENTS

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure shall fall within the protection scope of the present disclosure.

FIG. 1 is a schematic flowchart of a preparation method for a light emitting structure according to an embodiment of the present disclosure. FIG. 3A to FIG. 3F are exemplary schematic structural diagrams illustrating a preparation method for a light emitting structure according to the present disclosure. As shown in FIG. 1 and FIG. 3A to FIG. 3F, the method includes:

S110: Forming a mask layer on a substrate.

Therein the substrate is an n-type substrate. Since the n-type substrate has relatively good electrical conductivity and thermal conductivity, in the embodiment of the present disclosure, the n-type substrate is used, so that an epitaxial layer may be directly grown on the substrate and a second electrode may be directly disposed on a back surface of the substrate, without peeling off the substrate, simplifying the preparation method and reducing preparation costs.

In another embodiment, before the mask layer is formed on the substrate, a nucleation layer is formed first on the substrate. A material of the nucleation layer may be selected from AlN, AlGaN, and the like. When an Al atomic layer is desired to be selected as the metal atomic layer, an Al compound such as AlN or AlGaN that contains Al atoms is selected as the nucleation layer, so that the Al atomic layer may have better quantity and include fewer defects through homoepitaxial growth of the Al atomic layer.

S120: Disposing a plurality of openings in the mask layer.

Therein the mask layer may be made of silicon dioxide, silicon nitride, or the like.

Figures 3A, 3B, 3C, 3D:
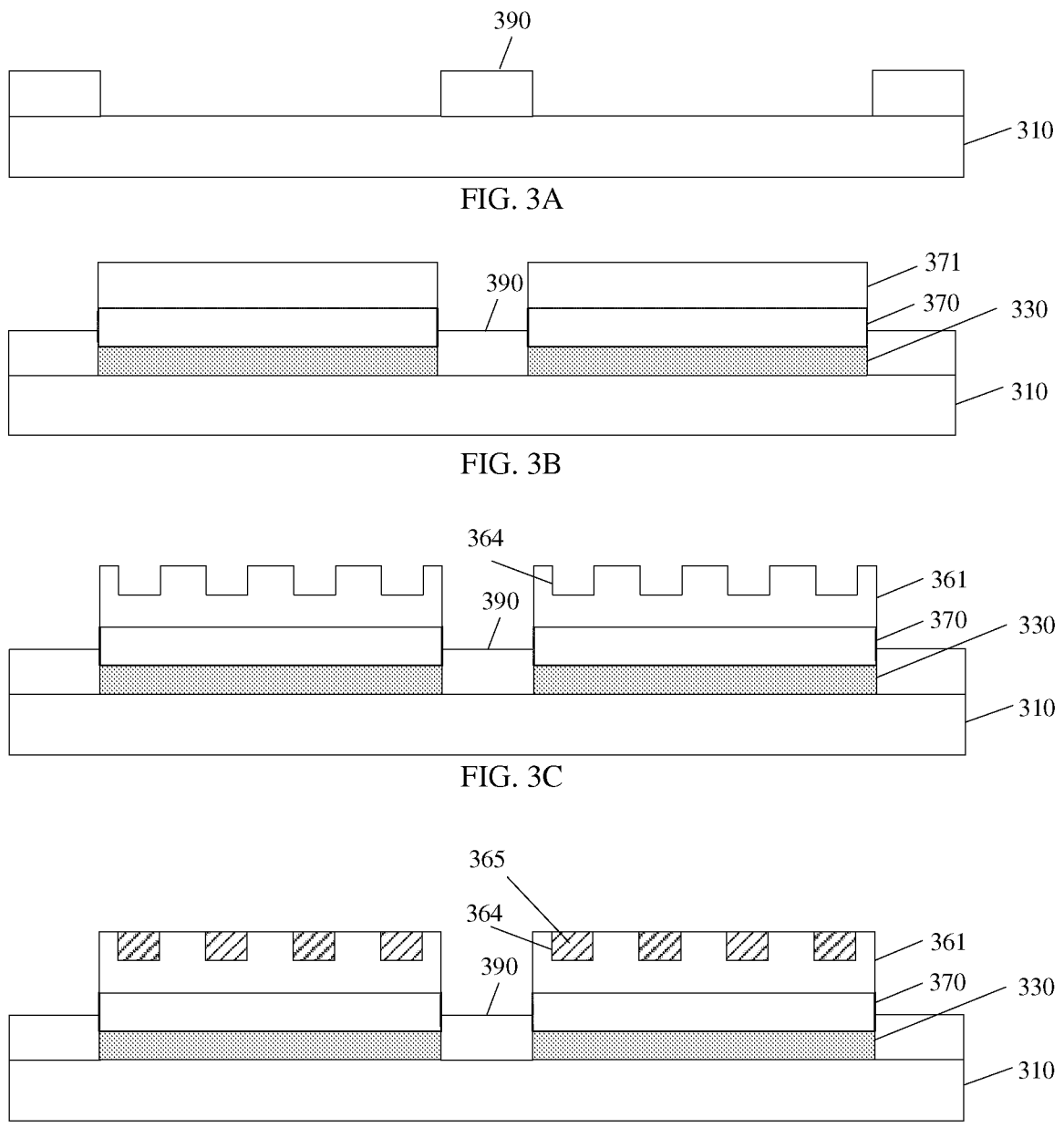
FIG. 3A to FIG. 3F are exemplary schematic structural diagrams illustrating a preparation method for a light emitting structure according to the present disclosure.

As shown in FIG. 3A, in an embodiment, a mask layer 390 having a plurality of openings may be formed on a substrate 310.

S130: Forming a light emitting unit in each of the plurality of openings.

Specifically, a light emitting unit may be formed in each of the plurality of openings, so as to obtain a plurality of light emitting units formed on the same substrate. According to such a method, a plurality of discrete light emitting structures formed on the same substrate and sharing a same second electrode may be directly obtained, so that a step of cutting a device is avoided, and damage to the device may be prevented. In addition, during manufacturing of a device that needs to be provided with a plurality of light emitting structures, by means of the preparation method provided in this embodiment, manufacturing steps may be reduced, and a process flow may be simplified.

In an embodiment, each light emitting unit may sequentially include a metal layer, an n-type semiconductor layer, an active layer, and a p-type semiconductor layer from bottom to top, and therefore, the method for forming a light emitting unit in each of the plurality of openings may specifically include the following steps.

S131: Forming a metal atomic layer in each of the plurality of openings.

Specifically, since metal has opacity, the metal atomic layer disposed below the light emitting structure may reflect light emitted by the light emitting structure, so that light extraction efficiency of the light emitting structure is effectively improved. In addition, since a substrate has high light absorption effect, when the metal atomic layer is disposed above the substrate, an adverse effect of the substrate on a light emitting effect of the light emitting structure may be effectively prevented.

In an embodiment, the metal atomic layer may be an Al atomic layer. Since the Al element and the Ga element are elements of a same group, when a buffer layer is prepared on the Al atomic layer, the buffer layer may be better grown and quality of the buffer layer may be improved based on such arrangement.

Optionally, in another embodiment, after the metal atomic layer is formed in each opening, the method further includes: forming a buffer layer on the metal atomic layer, where the buffer layer is an n-type buffer layer.

Specifically, a material of the n-type buffer layer may be selected from group III nitrides, such as gallium nitride, and aluminum gallium nitrogen.

Herein, the buffer layer may be used to greatly alleviate a stress generated when an epitaxial layer grows on the substrate, and implement filtering of dislocation, so that crystal quality of the epitaxial layer may be improved.

Further, in another embodiment, after the buffer layer is formed, at least one porous semiconductor layer may further be formed on the buffer layer. When there are a plurality of porous semiconductor layers, different layers may have different porosities. The porous semiconductor layer may be made of porous gallium nitride.

As shown in FIG. 3B, in the plurality of openings of the mask layer 390, a metal atomic layer 330, an n-type buffer layer 370 and a porous semiconductor layer 371 may be formed sequentially.

S132: Sequentially forming the n-type semiconductor layer, the active layer, and the p-type semiconductor layer on the metal atomic layer.

Specifically, the n-type semiconductor layer may consist of a Group III nitride, such as gallium nitride, or aluminum gallium nitrogen; and the p-type semiconductor layer may consist of a Group III nitride, such as gallium nitride, or aluminum gallium. An electron from the n-type semiconductor layer and a hole generated from the p-type semiconductor layer are recombined in the active layer to release energy, thereby implementing light emission.

In an embodiment, the active layer may be a Multiquantum Well (MQW) layer.

To improve light extraction efficiency of the light emitting structure, a light extraction structure may be disposed in the light emitting unit. In an embodiment, S132 may specifically include the following steps.

S1321: Forming an n-type semiconductor layer on the metal atomic layer, and forming at least one groove on the n-type semiconductor layer.

S1322: Forming a light extraction structure in the at least one groove.

As shown in FIG. 3C, in an embodiment, after an n-type semiconductor layer 361 is formed on the n-type buffer layer 370, a plurality of grooves 364 may be formed on the n-type semiconductor layer 361.

Further, as shown in FIG. 3D, a light extraction structure 365 may be formed in each of the plurality of grooves 364 for improving light extraction efficiency of a light-emitting diode.

Herein, the light extraction structure may include a DBR structure and/or a photonic crystal structure.

The DBR structure consists of at least two semiconductor materials or at least two dielectric materials grown in a staggered manner, and the DBR structure may be used to obtain a high reflectivity for waves in a specific frequency range. Moreover, the greater a refractive index difference between materials forming the DBR structure is, the higher the reflection efficiency of the DBR structure is.

A photonic crystal is an artificial periodic dielectric structure with photonic band-gap (Photonic Band-Gap, PBG for short) characteristics. In such a periodic structure, waves in a specific frequency range cannot be propagated. That is, there is a "forbidden band" for the structure, and this is a so-called photonic band-gap characteristic.

S1323: Sequentially forming an active layer and a p-type semiconductor layer on the n-type semiconductor layer and the light extraction structure.

Based on the preparation method of the light emitting structure provided in the embodiment of the present disclosure, an epitaxial layer may be directly grown on a substrate and a second electrode may be directly disposed on a back surface of the substrate, without peeling off the substrate. Moreover, a plurality of discrete light emitting structures formed on the same substrate and sharing the same second electrode may be directly obtained by forming a plurality of light emitting units on the same substrate, so that a step of cutting a device is avoided, and damage to the device can be prevented. In addition, light extraction efficiency of the light emitting structure can be effectively improved by disposing a light extraction structure in the light emitting unit.

In an embodiment of the present disclosure, three adjacent light emitting units may constitute a pixel unit, where contents of indium in the light extraction structures of the three light emitting units are different from each other.

Specifically, a light emitting waveband may be controlled by adjusting a content of indium in the light extraction structure, so as to change color of a light emitted by each light emitting unit. In a light emitting unit, when a content of substance amount of indium is controlled to be greater than 50%, a wavelength of the light reflected by the light extraction structure is between 620 nm and 760 nm, and the color of the emitted light is red; when the content of substance amount of the indium ranges from 30% to 50%, the wavelength of the light reflected by the light extraction structure is between 500 nm and 560 nm, and the color of the emitted light is green; and when the content of substance amount of the indium is less than 30%, the wavelength of the light reflected by the light extraction structure is between 490 nm and 500 nm, and the color of the emitted light is blue.

For example, when each pixel unit includes three light emitting units, the three light emitting units may emit red light, green light, and blue light respectively, so as to form three primary colors of light, thereby jointly implementing a pixel unit capable of emitting white light.

Further, in another embodiment, areas of openings corresponding to the three light emitting units in each pixel unit are different from each other. In other words, areas of cross sections, parallel to the substrate, of light emitting units in the three light emitting units are different from each other.

Specifically, since red light has the longest wavelength, followed by green light and blue light, a light emitting unit having the largest opening area correspondingly in each pixel unit may be configured to emit red light, and a light emitting unit having smaller opening area is configured to emit green light, and a light emitting unit having the smallest opening area is configured to emit blue light.

Based on the preparation method of the light emitting structure provided in the embodiment of the present disclosure, a light emitting waveband is controlled by adjusting a content of indium in a light extraction structure, so as to change a color of the light emitted by each light emitting unit, making a plurality of light emitting units jointly form a pixel unit capable of emitting white light. This method may be used to replace ink jet printing performed in an ink jet printer (Ink Jet Printer, IJP) mode for depositing an RGB material in a traditional LED preparation method, thereby effectively overcoming disadvantages of low precision, high costs, short service life of a light emitting material and the like in the IJP mode.

Figure 2:
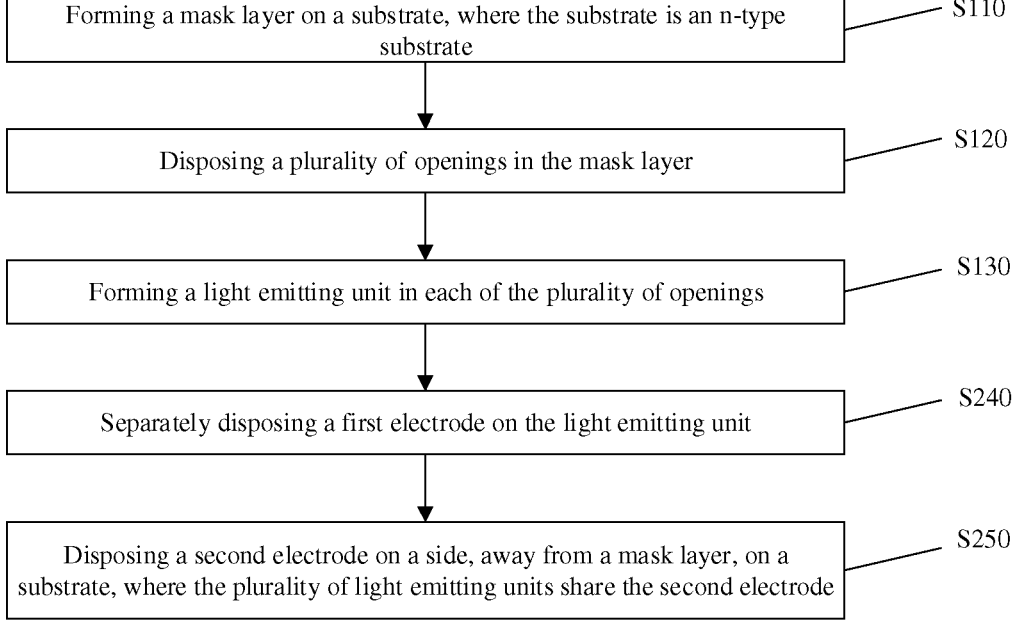
FIG. 2 is a schematic flowchart of a preparation method for a light emitting structure according to another embodiment of the present disclosure.

FIG. 2 is a schematic flowchart of a preparation method for a light emitting structure according to another embodiment of the present disclosure.

S240: Separately disposing a first electrode on the light emitting unit.

S250: Disposing a second electrode on a side of the substrate away from a mask layer, where a plurality of light emitting units share the second electrode.

Figure 3E:
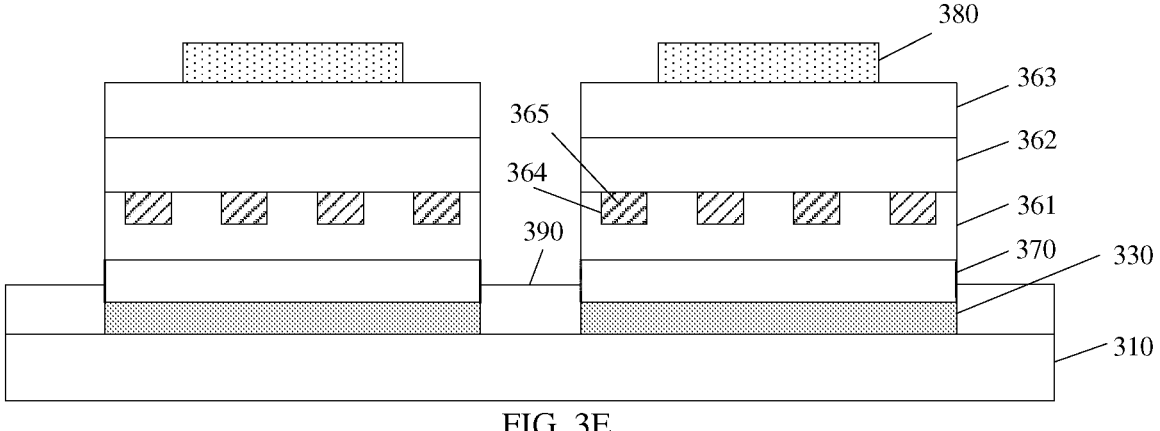
Figure 3F:
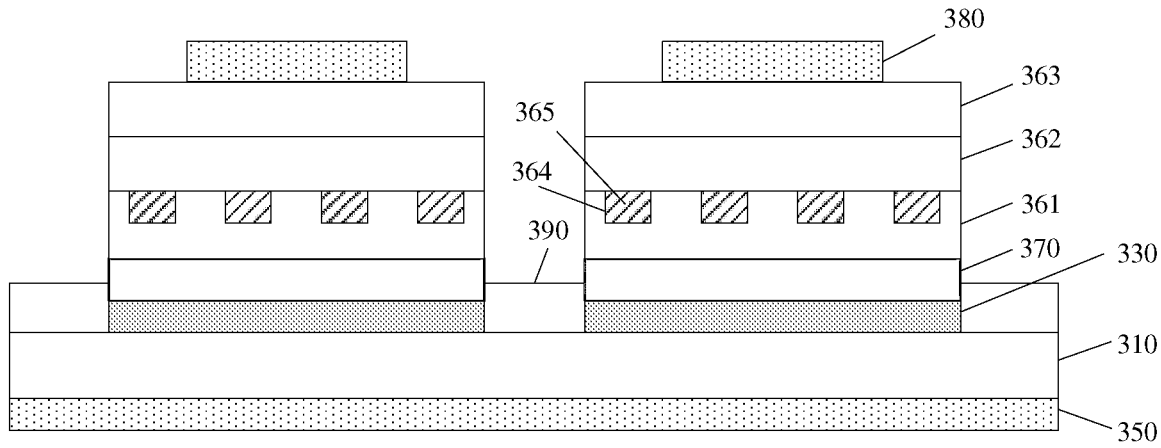

As shown in FIG. 3E and FIG. 3F, in an embodiment, after a light extraction structure 365 is formed in a groove 364 of an n-type semiconductor layer 361, an active layer 362, a p-type semiconductor layer 363, and a first electrode 380 may be sequentially formed on the n-type semiconductor layer 361 and the light extraction structure 365, and a second electrode 350 is disposed on the other side of a substrate 310 as the second electrode shared by the plurality of light emitting units on the substrate 310.

It should be understood that, some of the steps in the method of the embodiment illustrated in FIG. 2 are the same as those illustrated in FIG. 1, and details and effects thereof are not repeated herein.

Based on the preparation method of the light emitting structure provided in the embodiment of the present disclosure, a plurality of discrete light emitting structures formed on a same substrate and sharing a same second electrode may be obtained by disposing a separate first electrode and a common second electrode for a plurality of light emitting units formed on the same substrate, thereby avoiding a step of cutting a device, and preventing damage to the device.

Figure 4:
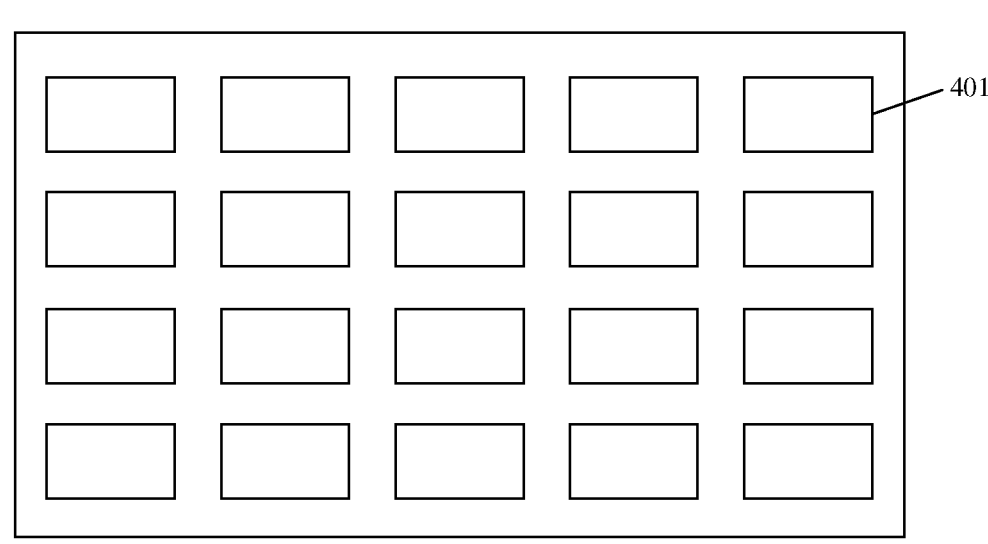
FIG. 4 is a top view of a schematic structural diagram of a light emitting structure according to an embodiment of the present disclosure.
Figure 5:
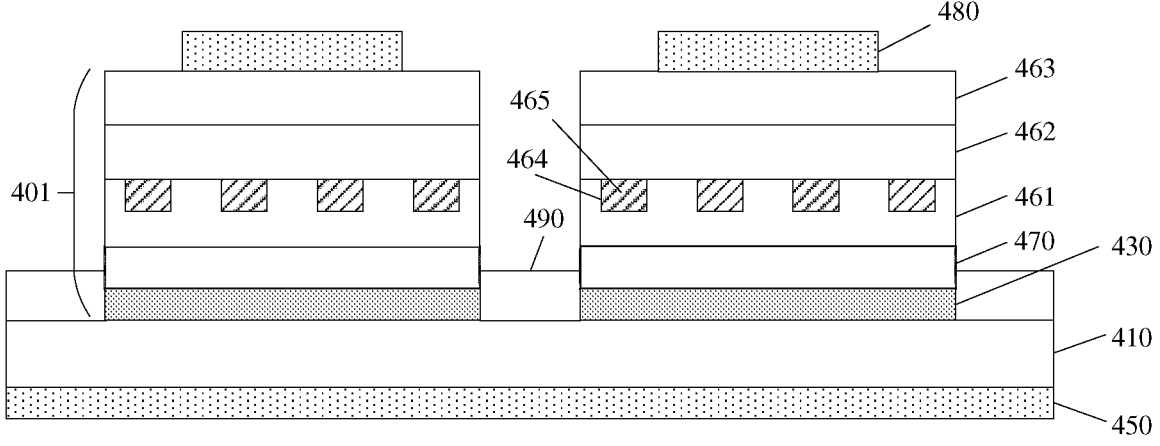
FIG. 5 is a front view of a schematic structural diagram of a partial cross section of the light emitting structure according to the embodiment illuminated in FIG. 4.

FIG. 4 is a top view of a schematic structural diagram of a light emitting structure according to an embodiment of the present disclosure. The light emitting structure may be obtained through the preparation methods illustrated in FIG. 1 and FIG. 2. FIG. 5 is a front view of a schematic structural diagram of a partial cross section of the light emitting structure according to the embodiment illuminated in FIG. 4.

As shown in FIG. 4 and FIG. 5, the light emitting structure 400 may include: a substrate 410, where the substrate 410 is an n-type substrate; a mask layer 490 formed on the substrate 410, where a plurality of openings are disposed in the mask layer 490; and a plurality of light emitting units 401 respectively formed in the plurality of openings, where each light emitting unit sequentially includes a metal atomic layer 430, an n-type semiconductor layer 461, an active layer 462, and a p-type semiconductor layer 463 from bottom to top, at least one groove 464 is disposed on the n-type semiconductor layer, and a light extraction structure 465 is disposed in the at least one groove 464.

The light extraction structure 465 may include a DBR structure and/or a photonic crystal structure.

Further, the light emitting structure 400 may further include: a second electrode 450 disposed on the back surface of the substrate 410, and a first electrode 480 disposed on each light emitting unit.

In an embodiment, the metal atomic layer 430 may be an Al atomic layer.

In an embodiment, the light emitting unit 401 may further include an n-type buffer layer 470 disposed between the metal atomic layer 430 and the n-type semiconductor layer 461.

Based on the light emitting structure provided in the embodiment of the present disclosure, a conductive n-type substrate, a common second electrode, and a plurality of light emitting units formed on the same substrate are used, so that device quality is greatly higher than that of a common light emitting structure, and an electronic device using the light emitting structure can have a simplified manufacturing process flow and lower manufacturing costs, and also can have higher light extraction efficiency by using a light extraction structure in the light emitting unit.

In an embodiment of the present disclosure, the light emitting structure may include a plurality of light emitting units, at least two adjacent light emitting units in the plurality of light emitting units form a pixel unit, and areas of openings corresponding to the at least two light emitting units are different from each other. In other words, areas of cross sections, parallel to the substrate, of light emitting units in the at least two light emitting units are different from each other.

Further, in each pixel unit, contents of indium in light extraction structures of the at least two light emitting units are different from each other. Specifically, a light emitting waveband may be controlled by adjusting a content of indium in the light extraction structure, so as to change color of a light emitted by each light emitting unit.

Figure 6:
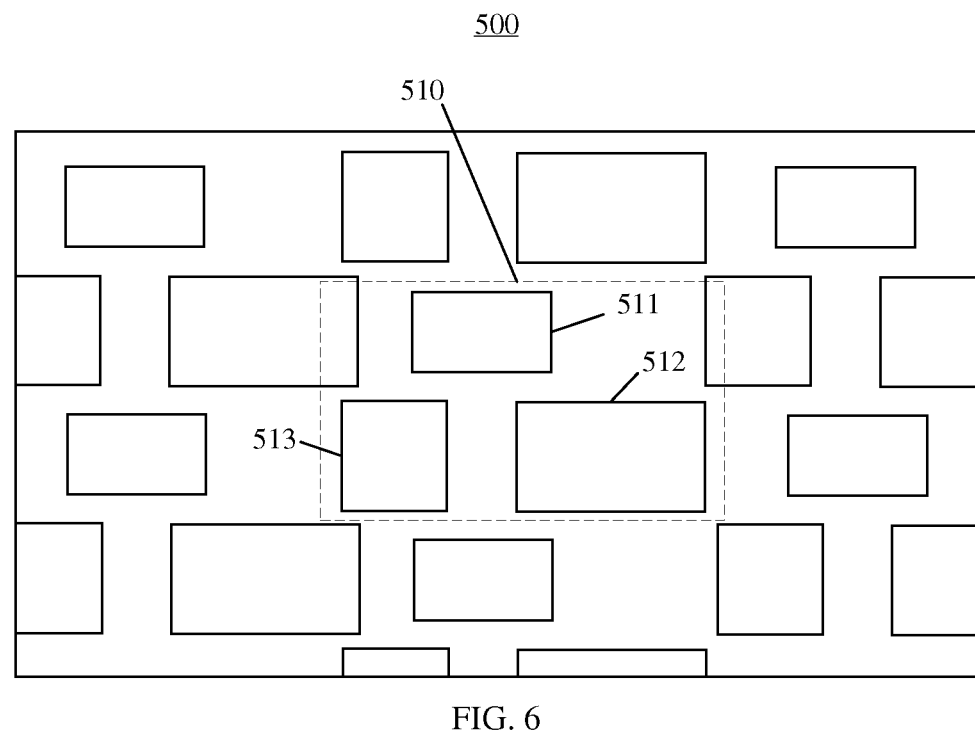
FIG. 6 is a top view of a schematic structural diagram of a light emitting structure according to another embodiment of the present disclosure.
Figure 7:
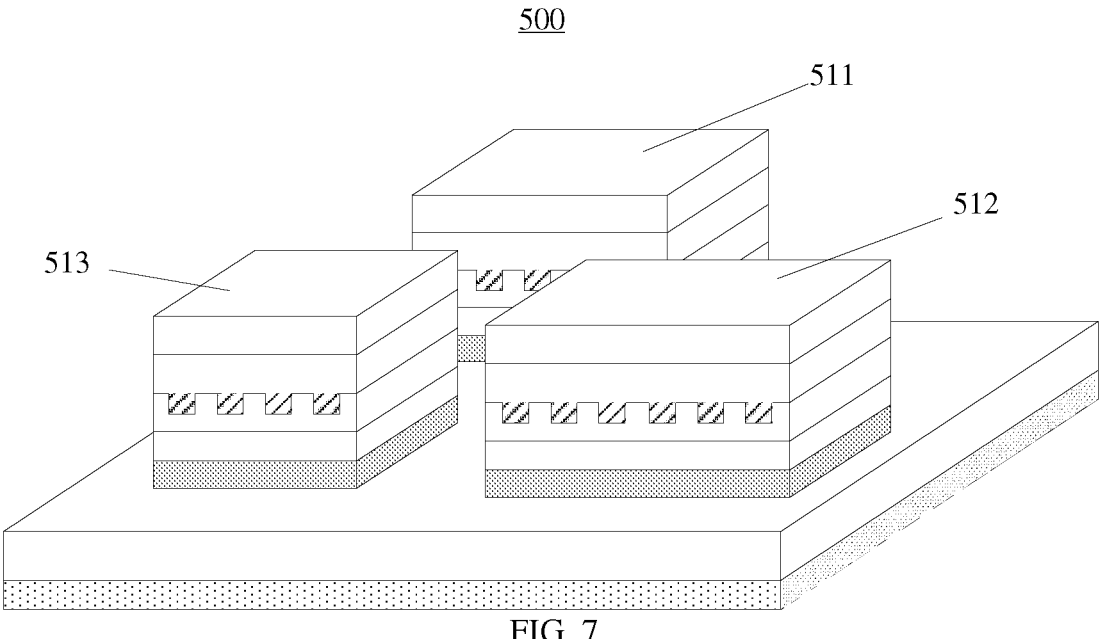
FIG. 7 is an oblique view of a schematic structural diagram of a pixel unit in the light emitting structure according to the embodiment illuminated in FIG. 6.

FIG. 6 is a top view of a schematic structural diagram of a light emitting structure according to another embodiment of the present disclosure. The light emitting structure may be obtained through the preparation methods illustrated in FIG. 1 and FIG. 2. FIG. 7 is an oblique view of a schematic structural diagram of a pixel unit in the light emitting structure according to the embodiment illuminated in FIG. 6 (no mask layer or first electrode is shown in FIG. 7).

As shown in FIG. 6 and FIG. 7, a light emitting structure 500 may include a plurality of pixel units 510, and each pixel unit 510 may include three light emitting units, which are respectively a first light emitting unit 511, a second light emitting unit 512, and a third light emitting unit 513.

When a content of substance amount of indium in a light extraction structure of the first light emitting unit 511 is greater than 50%, the first light emitting unit 511 emits red light; when a content of substance amount of indium in a light extraction structure of the second light emitting unit 512 ranges from 30% to 50%, the second light emitting unit 512 emits green light; and when a content of substance amount of indium in a light extraction structure of the third light emitting unit 513 is less than 30%, the third light emitting unit 513 emits blue light. Thus, the pixel unit 510 formed by the first light emitting unit 511, the second light emitting unit 512, and the third light emitting unit 513 can emit white light.

In another embodiment, since red light has the longest wavelength, followed by green light and blue light, the first light emitting unit 511 may be formed in an opening having the largest area, the second light emitting unit 512 may be formed in an opening having a smaller area, and the third light emitting unit 513 may be formed in an opening having the smallest area.

Based on the light emitting structure provided in the embodiment of the present disclosure, a light emitting waveband is controlled by adjusting a content of indium in a light extraction structure, so as to change a color of the light emitted by each light emitting unit, making a plurality of light emitting units jointly form a pixel unit capable of emitting white light. Compared with the conventional light-emitting diodes that inkjet print RGB materials through IJP, the light emitting structure provided in the embodiments of the present disclosure is easier to prepare and has better quality.

It should be understood that, the structural embodiments illustrated in FIG. 4 to FIG. 7 correspond to the method embodiments illustrated in FIG. 1 and FIG. 2, and details and effects thereof are be repeated herein.

Figures 8, 9:
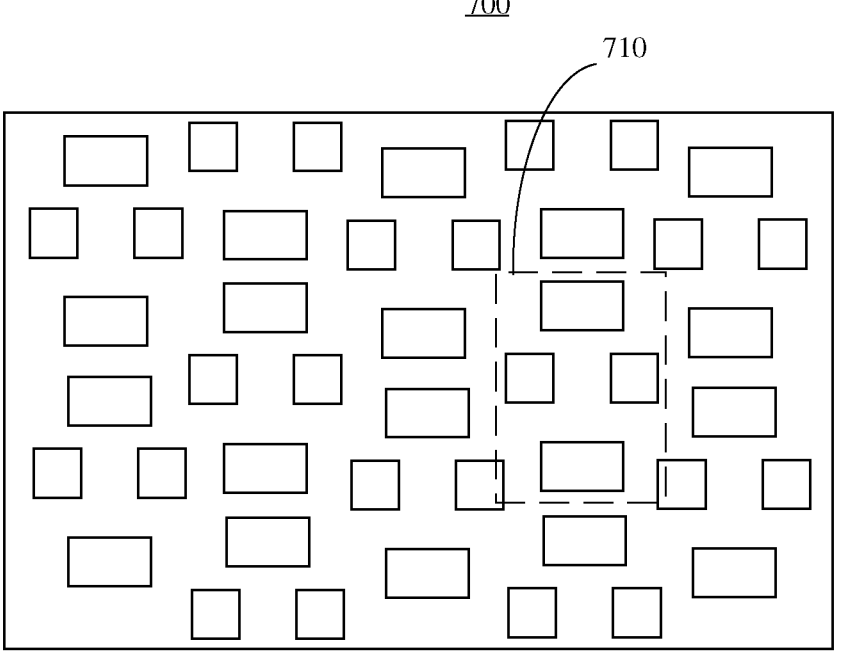
FIG. 8 is a top view of a schematic structural diagram of a light emitting structure according to another embodiment of the present disclosure.
FIG. 9 is a top view of a schematic structural diagram of a light emitting structure according to another embodiment of the present disclosure.

FIG. 8 and FIG. 9 are top views of schematic structural diagrams of light emitting structures according to other embodiments of the present disclosure. The light emitting structures shown in FIG. 8 and FIG. 9 may be obtained through the preparation method illustrated in FIG. 1 and FIG. 2. The light emitting units in FIG. 8 have the same opening area, forming a standard RGB array, in which a pixel unit 610 is a repeating unit. Meanwhile, as shown in FIG. 9, the light emitting units have different opening areas, and a 2in1 arrangement may be formed through the preparation method of the method embodiment illustrated in FIG. 1 and FIG. 2, in which a pixel unit 710 is a repeating unit. Not limited to the foregoing embodiments, according to the structure and preparation method in the present disclosure, a Pentile arrangement, a Diamind arrangement, an RGBW arrangement, an RGB Delta arrangement (not shown) and the like may also be prepared.

It should also be noted that, in the description of the present disclosure, unless otherwise specified and limited, the terms "dispose", "form", "have", and the like should be understood in a broad sense. For persons of ordinary skill in the art, specific meanings of the foregoing terms in the present disclosure may be understood based on specific cases.

It should also be noted that, orientations or position relationships indicated by the terms "upper", "lower", "inner", "outer", and the like are orientations or position relationships based on the accompanying drawings, or the orientations or position relationships that a product of the present disclosure usually placed when being used, which are merely intended to facilitate the description of the present disclosure and simplify the description, rather than indicating or implying that the referred apparatus or element must have a particular orientation or be constructed and operated in a particular orientation. Therefore, these terms should not be interpreted as a limitation the present disclosure.

The foregoing descriptions are merely preferable embodiments of the present disclosure, but are not intended to limit the present disclosure. Any modification, equivalent replacement, and the like made without departing from the spirit and principle of the present disclosure shall fall within the protection scope of the present disclosure.

What is claimed is:

1. A light emitting structure, comprising:
   a substrate, wherein the substrate is an n-type substrate;
   a mask layer formed on the substrate, wherein a plurality of openings are disposed in the mask layer; and
   a plurality of light emitting units formed in the plurality of openings respectively, wherein each of the plurality of light emitting units sequentially comprises a metal atomic layer, an n-type semiconductor layer, an active layer, and a p-type semiconductor layer from bottom to top, at least one groove is disposed on the n-type semiconductor layer, and a light extraction structure is disposed in the at least one groove;

a first electrode separately disposed on each of the plurality of light emitting units; and
   a second electrode disposed on a side of the substrate away from the mask layer, wherein the plurality of light emitting units formed in the plurality of openings respectively share the second electrode.

2. The light emitting structure according to claim 1, wherein
   the metal atomic layer is an Al atomic layer or a Mg atomic layer.

3. The light emitting structure according to claim 1, wherein each of the plurality of light emitting units further comprises:
   a buffer layer disposed between the metal atomic layer and the n-type semiconductor layer.

4. The light emitting structure according to claim 3, wherein each of the plurality of light emitting units further comprises:
   at least one porous semiconductor layer disposed between the buffer layer and the n-type semiconductor layer.

5. The light emitting structure according to claim 4, wherein
   the at least one porous semiconductor layer comprises a plurality of porous semiconductor layers, and different porous semiconductor layers have different porosities.

6. The light emitting structure according to claim 4, wherein the porous semiconductor layer is made of porous gallium nitride.

7. The light emitting structure according to claim 1, wherein
   the light extraction structure comprises a DBR structure and/or a photonic crystal structure.

8. The light emitting structure according to claim 1, wherein
   three adjacent light emitting units constitute a pixel unit, and contents of indium in the light extraction structures of the three light emitting units are different from each other.

9. The light emitting structure according to claim 8, wherein
   in each pixel unit, areas of openings corresponding to the three light emitting units are different from each other.

10. The light emitting structure according to claim 1, wherein a side, facing the substrate, of the active layer is higher than a side, facing away from the substrate, of the mask layer.

* * * * *